(12) United States Patent         (10) Patent No.:     US 7,847,322 B2
Yamada et al.                     (45) Date of Patent:    Dec. 7, 2010

(54) SEMICONDUCTOR MEMORY DEVICE AND METHOD OF MANUFACTURING THE SAME

(75) Inventors: Takashi Yamada, Ebina (JP); Tomoaki Shino, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 323 days.

(21) Appl. No.: 11/753,704

(22) Filed: May 25, 2007

(65) Prior Publication Data

US 2007/0284661 A1    Dec. 13, 2007

(30) Foreign Application Priority Data

Jun. 13, 2006    (JP)    ............... 2006-163859

(51) Int. Cl.
  *H01L 21/84*    (2006.01)
(52) U.S. Cl. ............... 257/213; 257/347; 257/E29.273; 438/149
(58) Field of Classification Search ............... 257/213
    See application file for complete search history.

(56) References Cited

U.S. PATENT DOCUMENTS 6,778,424  B2    8/2004   Iwata et al.
7,075,820  B2    7/2006   Yamada et al.
2004/0126969 A1 *  7/2004   Brown et al. ............... 438/257

FOREIGN PATENT DOCUMENTS

JP    2003-86712    3/2003
JP    2005-191451    7/2005

OTHER PUBLICATIONS

Sung Min Kim, et al. "A Novel Multi-channel Field Effect Transistor (McFET) on Bulk Si for High Performance Sub-80nm Application," IEDM, IEEE, 2004, pp. 639-642.
Takashi Ohsawa, et al., "Memory Design Using a One-Transistor Gain Cell on SOI," IEEE journal of Solid-State Circuits, vol. 37, No. 11, Nov. 2002, pp. 1510-1522.

* cited by examiner

*Primary Examiner*—Jarrett J Stark
*Assistant Examiner*—Lawrence Tynes, Jr.
(74) *Attorney, Agent, or Firm*—Oblon, Spivak, McClelland, Maier & Neustadt, L.L.P.

(57) ABSTRACT

This disclosure concerns a semiconductor memory device comprising a semiconductor substrate; a first dielectric film provided on the semiconductor substrate; two Fins provided on the first dielectric film and made of a semiconductor material; a second dielectric film provided on facing inner side surfaces among side surfaces of the two Fins; a third dielectric film provided on outer side surfaces among side surfaces of the two Fins; a gate electrode provided via the second dielectric film between the inner side surfaces of the two Fins; and a plate electrode provided via the third dielectric film on the outer side surfaces of the two Fins, wherein the two Fins, the gate electrode, and the plate electrode are included in one memory cell.

14 Claims, 24 Drawing Sheets

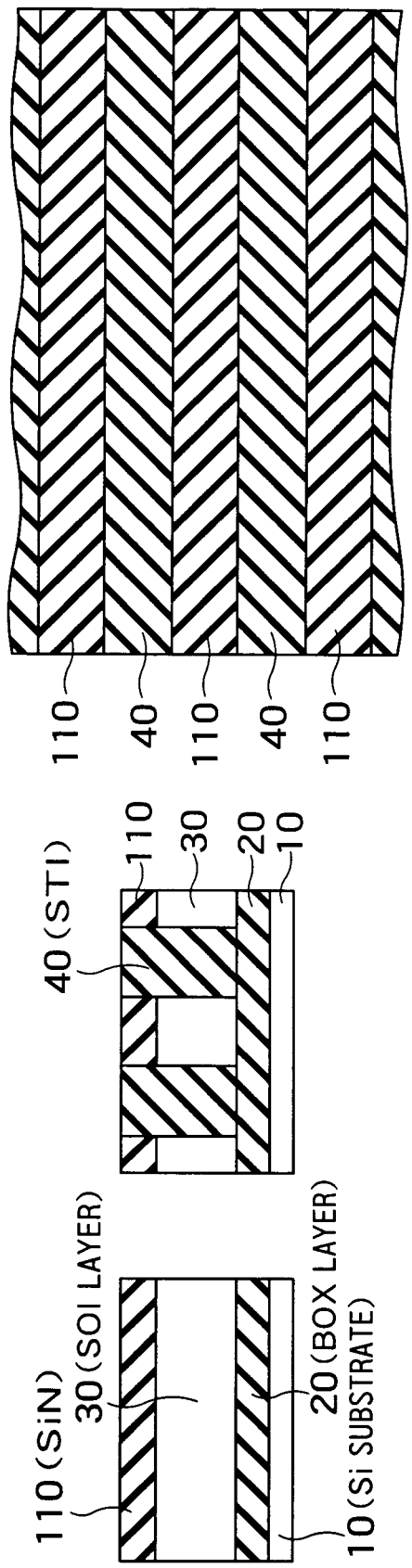

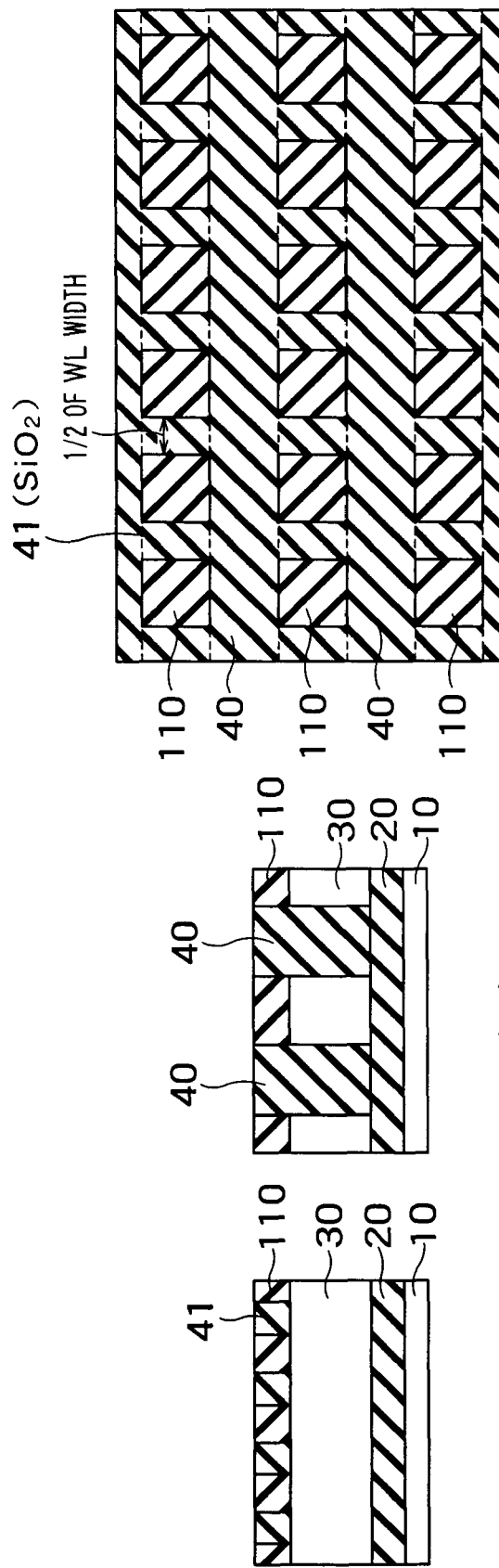

SEMICONDUCTOR MEMORY DEVICE AND METHOD OF MANUFACTURING THE SAME

CROSS-REFERENCE TO RELATED APPLICATION

This application is based upon and claims the benefit of priority from the prior Japanese Patent Application No. 2006-163859, filed on Jun. 13, 2006, the entire contents of which are incorporated herein by reference.

BACKGROUND OF THE INVENTION

1. Field of the Invention

The present invention relates to a semiconductor memory device and a method of manufacturing the semiconductor memory device.

2. Related Art

In recent years, an FBC (Floating Body Cell) memory device is proposed as one of semiconductor memory devices expected as a memory replacing a DRAM (Dynamic Random Access Memory). In the FBC memory device, an FET (Field Effect Transistor) having a floating body (hereinbelow, also simply called body) is formed on an SOI (Silicon On Insulator) substrate, and data "1" or "0" is stored by the number of majority carriers stored in the body. In the case where the FBC is an n-type FET, data is stored by the number of holes in the body.

To improve the retention characteristic of the data in the FBC, there is a case that a plate electrode is provided on a side surface or a bottom surface of the body. By the adequate potential of the plate electrode, the body potential can be stabilized, and the signal difference between data "1" and data "0" and the data retention characteristic can be improved.

As an FD (Fully Depleted) type FBC in which the body is fully depleted, a fin-type FET has been developed. In the Fin-type FET, gate electrodes are provided on both side surfaces of the body, and the both side surfaces of the body are used as channel (multi-channel). With the configuration, the drive current between the source and drain can be increased.

In the case of applying the fin-type to the FBC memory, however, since the fin-type FET has gate electrodes on both side surfaces of the body, the plate electrode cannot be provided on the side surfaces of the body. Although the plate electrode can be provided on the bottom surface of a Fin, the width of the Fin (width between both side surfaces along which channels are formed) has to be narrowed to form an FD type FBC. Therefore, it is difficult to sufficiently assure the capacitance between the plate electrode and the body only by the bottom surface of the Fin.

SUMMARY OF THE INVENTION

A semiconductor memory device according to an embodiment of the present invention comprises a semiconductor substrate; a first dielectric film provided on the semiconductor substrate; two Fins provided on the first dielectric film and made of a semiconductor material; a second dielectric film provided on facing inner side surfaces among side surfaces of the two Fins; a third dielectric film provided on outer side surfaces among side surfaces of the two Fins; a gate electrode provided via the second dielectric film between the inner side surfaces of the two Fins; and a plate electrode provided via the third dielectric film on the outer side surfaces of the two Fins, wherein the two Fins, the gate electrode, and the plate electrode are included in one memory cell.

A semiconductor memory device according to an embodiment of the present invention comprises a semiconductor substrate; a first dielectric film provided on the semiconductor substrate; two Fins provided on the first dielectric film and made of a semiconductor material; a second dielectric film provided on facing inner side surfaces among side surfaces of the two Fins; a third dielectric film provided on outer side surfaces among side surfaces of the two Fins; a plate electrode provided via the second dielectric film between the two Fins; and a gate electrode provided via the third dielectric film on the outer side surfaces of the two Fins, wherein the two Fins, the gate electrode, and the plate electrode are included in one memory cell.

A method of manufacturing a semiconductor memory device according to an embodiment of the present invention comprises preparing an SOI substrate having a silicon substrate, a buried insulating film, and an SOI layer; forming a mask material on the SOI layer so as to cover an active area; forming a first trench by removing the SOI layer in an isolation formation area by using the mask material; forming a capacitor dielectric film on a side surface of the SOI layer in the first trench; covering the capacitor dielectric film with a polysilicon film; etching the buried insulating film exposed at the bottom of the first trench; filling a plate electrode in the first trench; forming a device isolation material on the plate electrode to the height level of the surface of the mask material; exposing side surfaces of the SOI layer and the device isolation material in the active area by removing the mask member; forming a spacer on the side surfaces of the device isolation material; processing the SOI layer to form Fin shape and forming a second trench in the SOI layer by etching the SOI layer using the device isolation material and the spacer as masks; forming gate dielectric films on the side surfaces of the SOI layer in the second trench; and burying a gate electrode in the second trench.

A method of manufacturing a semiconductor memory device according to an embodiment of the present invention comprises preparing an SOI substrate having a silicon substrate, a buried insulating film, and an SOI layer; forming a first mask material on the SOI layer so as to cover an active area; forming a first trench by removing the SOI layer in an isolation formation area by using the first mask material; filling a device isolation material in the first trench to the height level of the surface of the first mask material; removing the first mask material located on a source formation area and a drain formation area of the SOI layer; filling a second mask material on the source formation area and the drain formation area; removing the first mask material located on the active area to expose a side surface of the device isolation material; forming a first spacer on the side surfaces of the device isolation material; processing the SOI layer to form Fin shape and forming a second trench in the SOI layer by etching the SOI layer using the device isolation material and the first spacer as masks; forming a capacitor dielectric film on a side surface of the SOI layer in the second trench; covering the capacitor dielectric film with a polysilicon film; etching the buried insulating film exposed at the bottom of the second trench; filling a plate electrode in the second trench; forming a device isolation material on the plate electrode to the height level of the surface of the mask material; removing the device isolation material adjacent to the Fin of the SOI layer to expose a first side surface of the SOI layer, the first side surface being located on the opposite side of a side surface provided with the capacitor dielectric film, and to form a third trench adjacent to the Fin; forming gate dielectric films on the first side surface of the Fin; burying a gate electrode in the third trench.

BRIEF DESCRIPTION OF THE DRAWINGS

FIGS. 17A to 24B are cross sections showing a method of manufacturing an FBC memory of the second embodiment;

DETAILED DESCRIPTION OF THE INVENTION

Embodiments of the present invention will be described below with reference to the drawings. The invention is not limited to the embodiments.

First Embodiment

Figure 1:
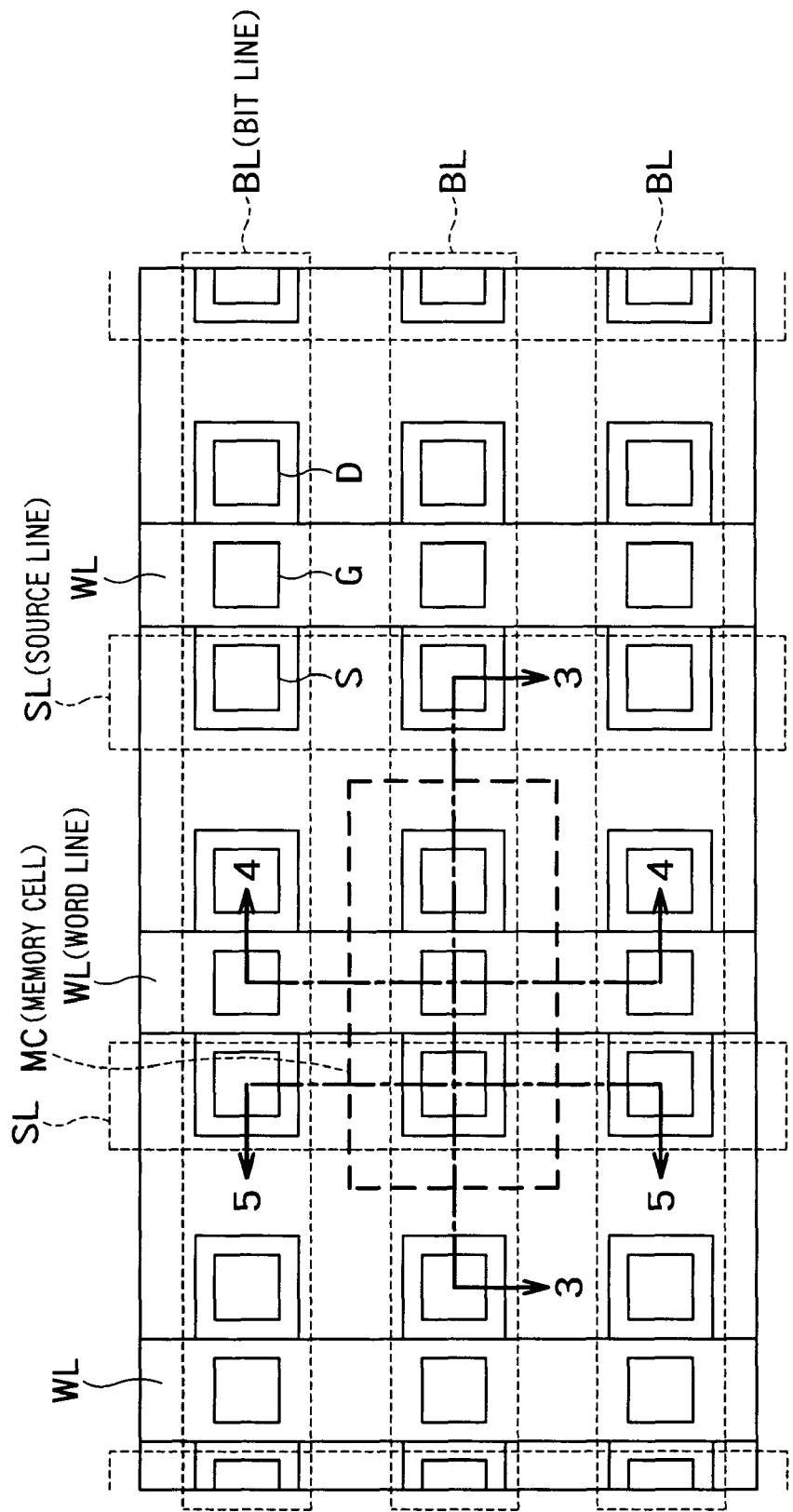
FIG. 1 is a plan view of an FBC memory of a first embodiment of the invention.

FIG. 1 is a plan view of an FBC memory of a first embodiment of the invention. A portion indicated in a broken-line frame in FIG. 1 illustrates a memory cell MC. Memory cells MC are arranged in a matrix and form a memory cell array. Word lines WL extend in the column direction of the memory cell array and connected to gate electrodes G of the memory cells MC. Bit lines BL extend in the row direction of the memory cell array and each of the bit lines BL is connected to either the source or drain (hereinafter, drain D) of the memory cell MC via a contact plug. Source lines SL extend in parallel with the word lines WL. Each of the source lines SL is connected to the other one of the source and the drain (hereinafter, the source S) of the memory cell MC via the contact plug. The arrangement of the memory cells and the configuration of the upper layer wiring can be appropriately changed. Thus the word line extending direction may be set in the row direction, and the bit line extending direction may be set in the column direction.

Figure 2:
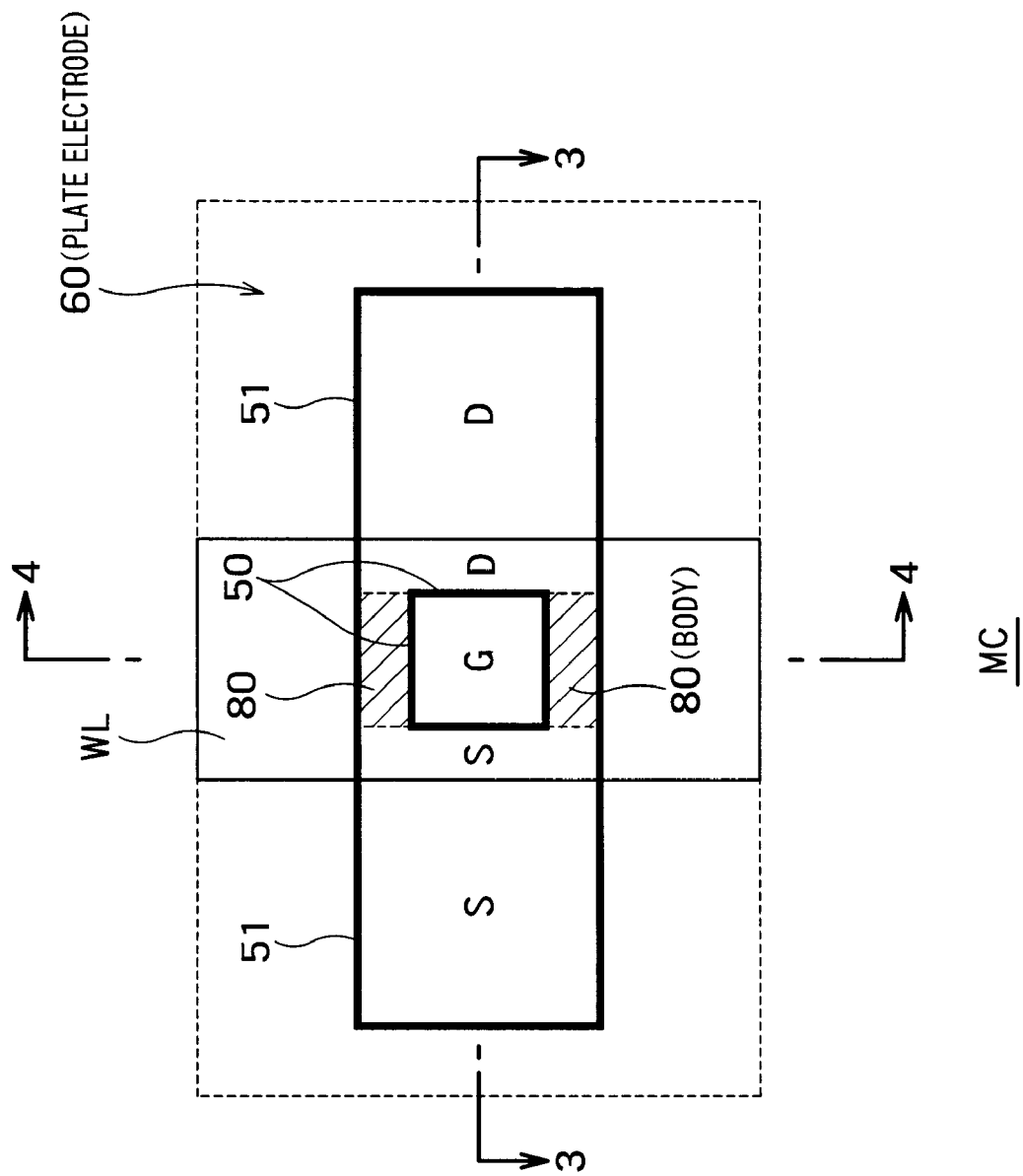
FIG. 2 is a plan view showing one memory cell MC more specifically.

FIG. 2 is a plan view showing one memory cell MC more specifically. In the embodiment, bodies 80 are provided not fully but partly in the space between the source and drain. The gate electrode G is buried in remaining portion of the space between the source and the drain.

Figure 3:
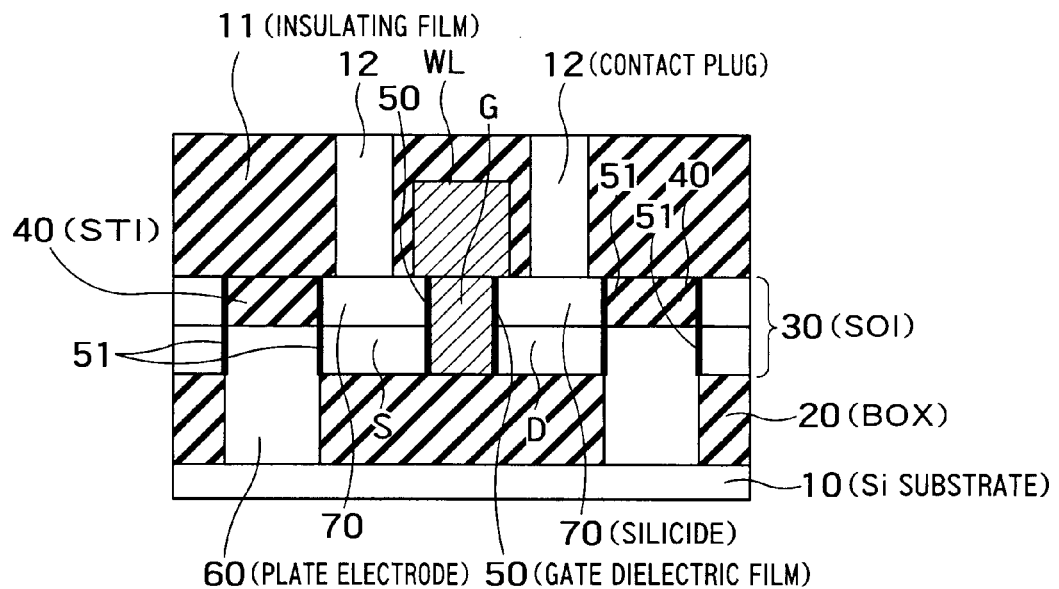
FIG. 3 is a cross section taken along line 3-3 (in the channel length direction) of FIGS. 1 and 2.

FIG. 3 is a cross section taken along line 3-3 (in the channel length direction) of FIGS. 1 and 2. The FBC memory of the embodiment is formed on an SOI substrate having a silicon substrate 10, a BOX (Buried Oxide) layer 20 as a first dielectric film, and an SOI (Silicon On Insulator) layer 30. In the SOI layer 30, diffusion layers of a source S and a drain D are formed. Silicide layers 70 are formed on the diffusion layers of the source S and the drain D. The source S is connected to the source line SL via a contact plug 12, and the drain D is connected to the bit line BL via the contact plug 12. The contact plugs 12 are made of, for example, a low-resistant metal such as tungsten. The gate electrode G is provided via gate dielectric films 50 as a second dielectric film between the source S and the drain D. The gate electrode G is connected to the word line WL.

Plate electrodes 60 are provided via capacitor dielectric films 51 as a third dielectric film on the outside of the source S and the drain D. The plate electrodes 60 are adjacent to the source S and the drain D and are connected to the silicon substrate 10 penetrating the BOX layer 20. STIs 40 are provided on the plate electrodes 60. The contact plugs 12 and the word line WL are insulated from each other by dielectric films 11.

Figure 4:
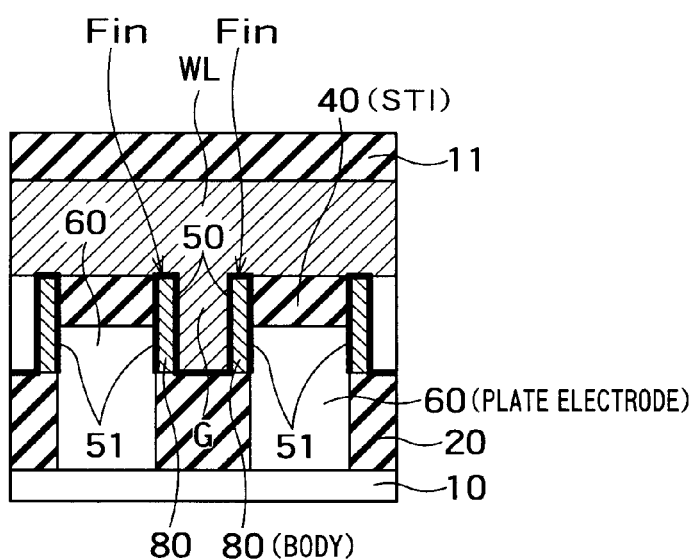
FIG. 4 is a cross section taken along line 4-4 (the width direction of the Fin) shown in FIGS. 1 and 2.

FIG. 4 is a cross section taken along line 4-4 (the width direction of the Fin) shown in FIGS. 1 and 2. The bodies 80 are provided on the BOX layers 20 and are formed in a fin-shape by processing the SOI layer 30. The gate dielectric films 50 as the second dielectric films are formed on the inner side surfaces which are opposed to each other among the side surfaces of the bodies 80 (Fin) in the memory cell MC. The capacitor dielectric films 51 as the third dielectric films are provided on the outer side surfaces of the bodies 80. The gate dielectric films 50 are provided between the gate electrode G and the bodies 80. Specifically, the gate electrode G is provided between the inner side surfaces of the two Fins via the gate dielectric films 50 in the memory cell MC. The capacitor dielectric films 51 are provided between the plate electrodes 60 and the bodies 80. Specifically, the plate electrodes 60 are provided on the outer side surfaces of the two Fins.

Since the gate electrode G is buried between the two bodies 80, the channels are formed on both side surfaces of the gate electrode G and the thickness of the two bodies 80 is reduced. Therefore, the FBC of the embodiment has large effective channel width, so that high current drive ability can be displayed. In addition, the FBC of the embodiment can be constructed in an FD-type FET.

The outer side surfaces of the bodies 80 (Fin) are in contact with the plate electrodes 60 via the capacitor dielectric films 51. Therefore, although the FBC of the embodiment is constructed in a fin-type FET, the FBC can include a capacitor having sufficiently large capacitance between the body 80 and the plate electrode 60. As a result, in the FBC memory of the embodiment, the signal difference between data "1" and data "0" can be made large, and the data retention characteristic can be improved.

In the embodiment, to apply desired potential from the silicon substrate 10 to the plate electrodes 60, the plate electrodes 60 are connected to the silicon substrate 10 penetrating the BOX layer 20. Alternatively, the plate electrodes 60 may be connected to wires provided around the memory cell array, and desired potential may be applied from the wires to the plate electrodes 60. In this case, it is unnecessary to provide the plate electrodes 60 so as to penetrate the BOX layer 20.

In the embodiment, the bottom surfaces of the gate electrodes G are adjacent to the BOX layers 20. Alternatively, the depth of the bottom surfaces of the gate electrodes G may be reduced to allow the SOI layers 30 remain under the bottom surfaces of the gate electrodes G. In other words, two Fins may be connected under the gate electrode G in the memory cell MC. In this case, the SOI layers 30 under the bottom surfaces of the gate electrodes G also function as the channel. As a result, the channel width can be further wide, so that the current drive ability of the FBC can be further improved.

In the embodiment, the STIs 40 are provided on the plate electrodes 60. By changing the depth of the STIs 40, the capacitance between the plate electrodes 60 and the bodies 80 can be changed.

Next, a method of manufacturing the FBC memory of the embodiment will be described. FIGS. 5A to 11B are cross sections showing a method of manufacturing the FBC memory of the first embodiment. FIGS. 5A, 6A, 7A, 8A, 9A, 10A, and 11A show a method of manufacturing the FBC memory in the cross section of FIG. 3. FIGS. 5B, 6B, 7B, 8B, 9B, 10B, and 11B show a method of manufacturing the FBC memory in the cross section of FIG. 4.

Figure 5A:
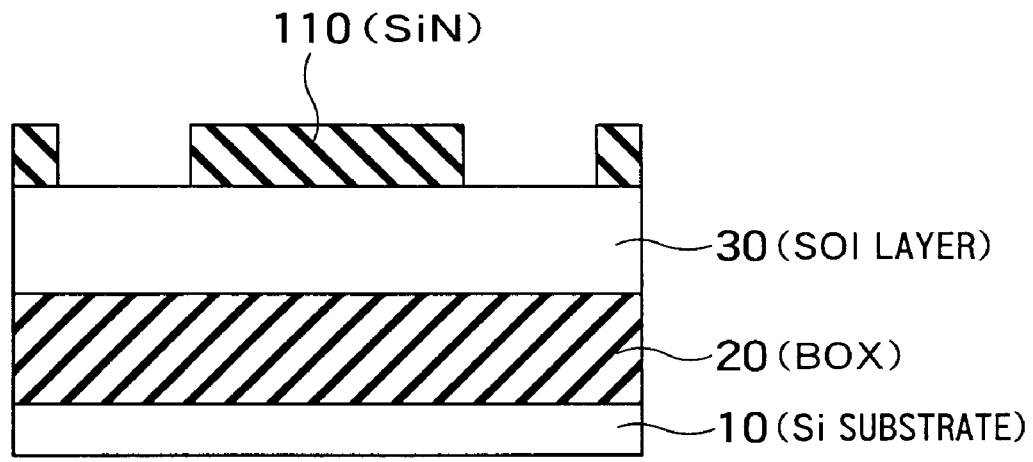
FIGS. 5A to 11B are cross sections showing a method of manufacturing an FBC memory of the first embodiment.
Figure 5B:
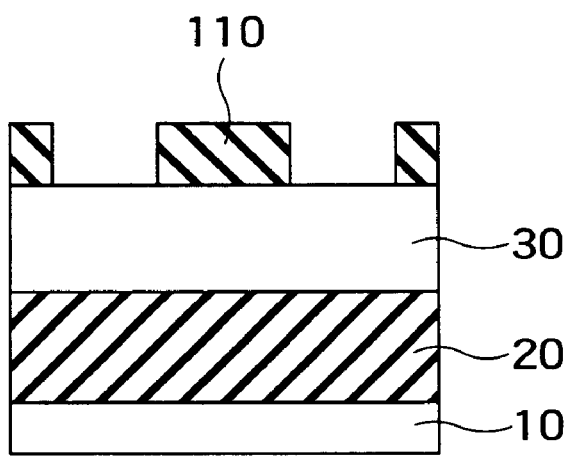

First, an SOI substrate is prepared. A silicon nitride film 110 is deposited on the SOI layer 30 to form hard masks. The silicon nitride film 110 is patterned so as to cover active areas. By the patterning, as shown in FIGS. 5A and 5B, the silicon nitride film 110 on the areas for forming the plate electrodes 60 and the STIs 40 is removed.

Figure 6A:
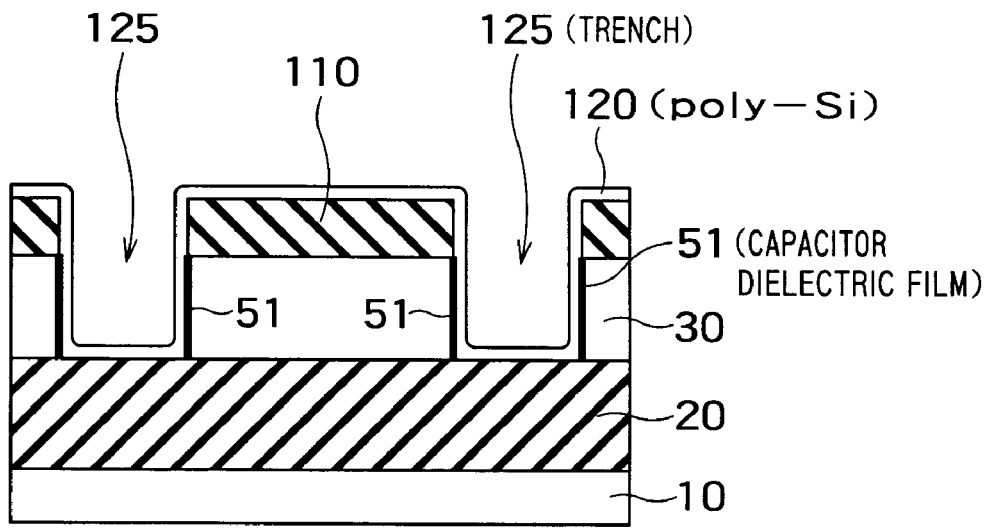
Figure 6B:
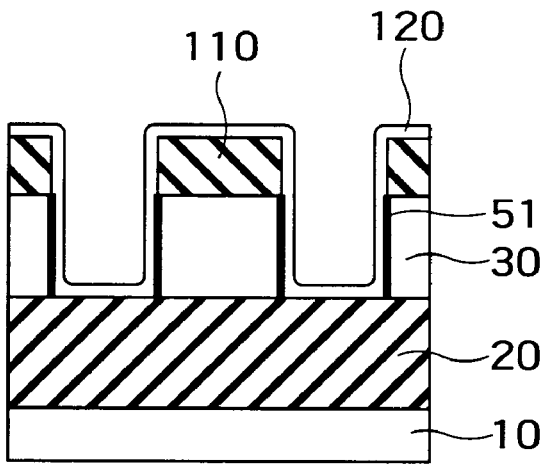

By using the silicon nitride films 110 as a mask, the SOI layer 30 is etched by RIE (Reactive Ion Etching). By the etching, the first trenches 125 are formed. Next, as shown in FIGS. 6A and 6B, the capacitor dielectric films 51 are formed on the side surfaces of the SOI layer 30 in the trench 125. The capacitor dielectric film 51 is, for example, a silicon oxide film. Further, a polysilicon film 120 is deposited on the capacitor dielectric films 51 so that the capacitor dielectric films 51 will not be etched in the following process. In this operation, the polysilicon film 120 is formed thinly on the capacitor dielectric films 51 so as not to close openings formed in the SOI layer 30. Further, by using RIE, the polysilicon film 120 at the bottoms of the trenches 125 is anisotropically etched to expose the BOX layer 20.

Figure 7A:
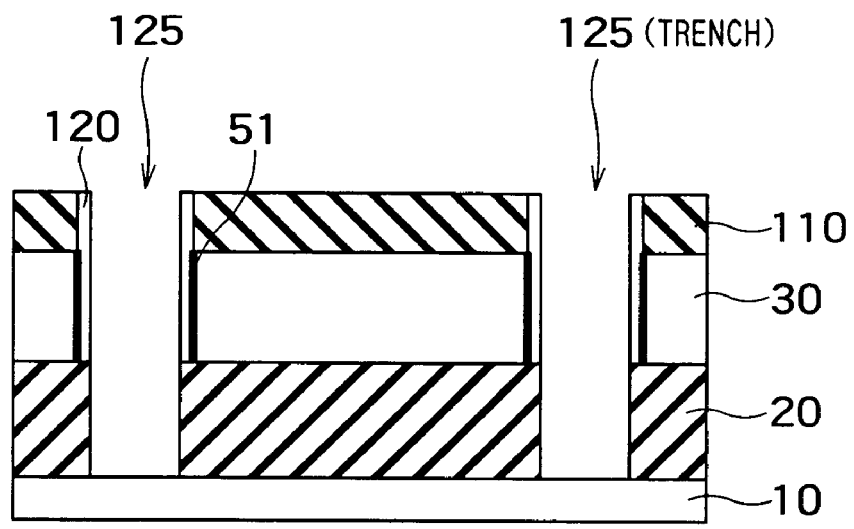
Figure 7B:
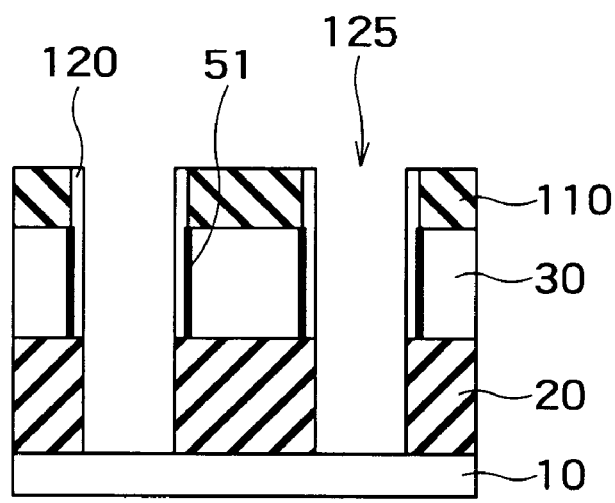

Subsequently, by using the silicon nitride film 110 and the polysilicon film 120 as a mask, the BOX layer 20 is etched by RIE. As shown in FIGS. 7A and 7B, the trenches 125 reaching the silicon substrate 10 are formed. Since the polysilicon films 120 protect the capacitor dielectric films 51, the capacitor dielectric films 51 are not etched.

Figure 8A:
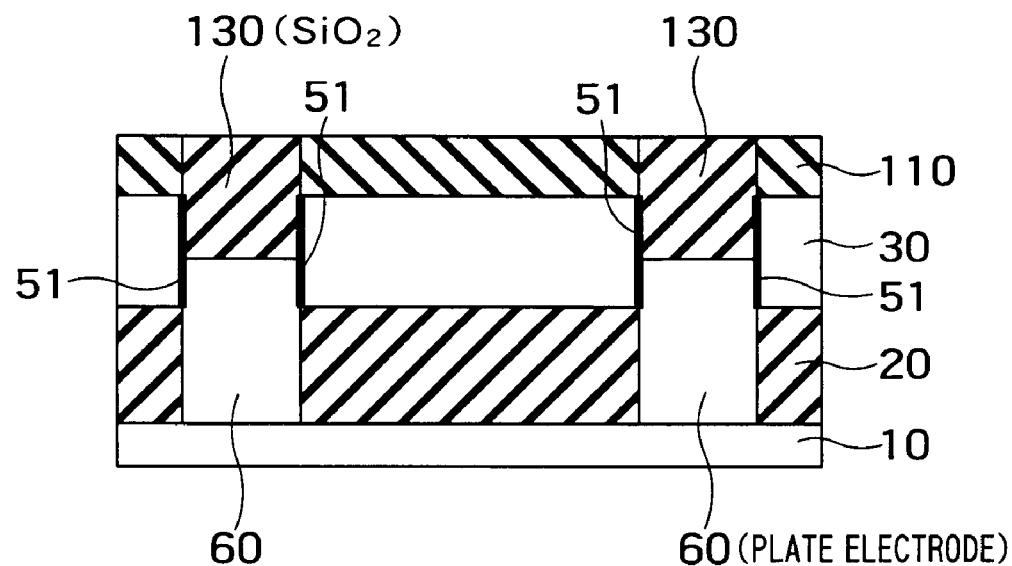
Figure 8B:
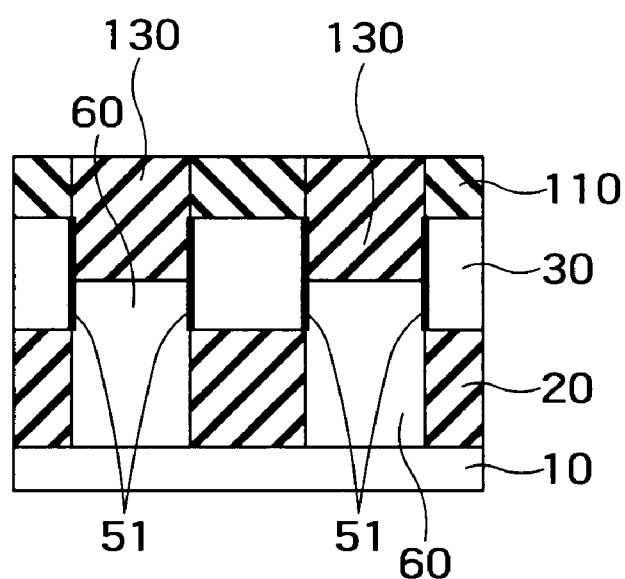

Next, the trench 125 is filled with polysilicon. By etching back the polysilicon, as shown in FIGS. 8A and 8B, the plate electrodes 60 are formed. In the process, by adjusting the etching amount of polysilicon, the capacitance between the plate electrode 60 and the body 80 can be adjusted. After that, a silicon oxide film 130 is deposited on the plate electrodes 60 to bury the trenches 125. Further, by using CMP (Chemical Mechanical Polishing), the silicon oxide film 130 is polished to the surface level of the silicon nitride film 110. As a result, the structure shown in FIGS. 8A and 8B is obtained.

Figure 9A:
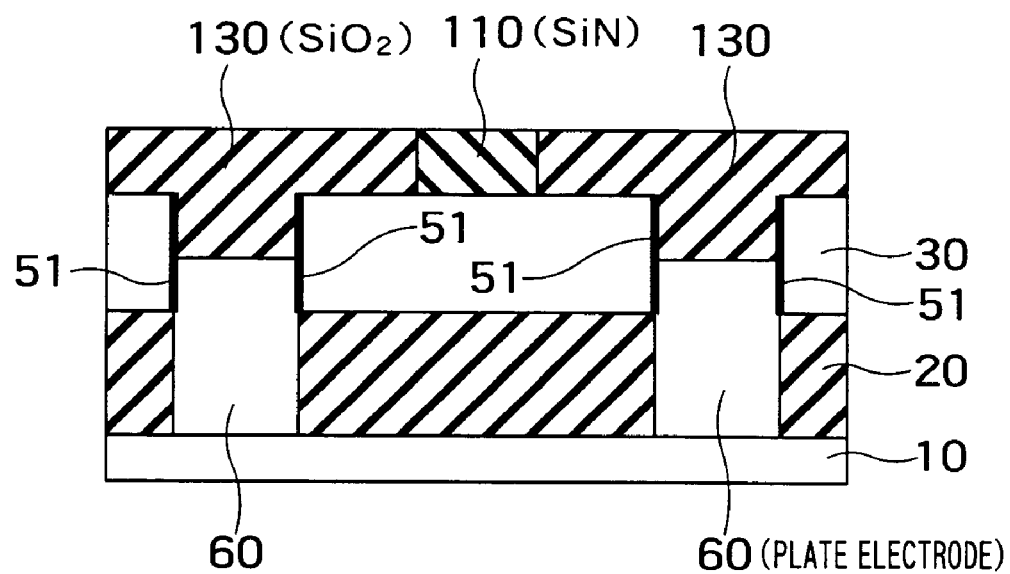
Figure 9B:
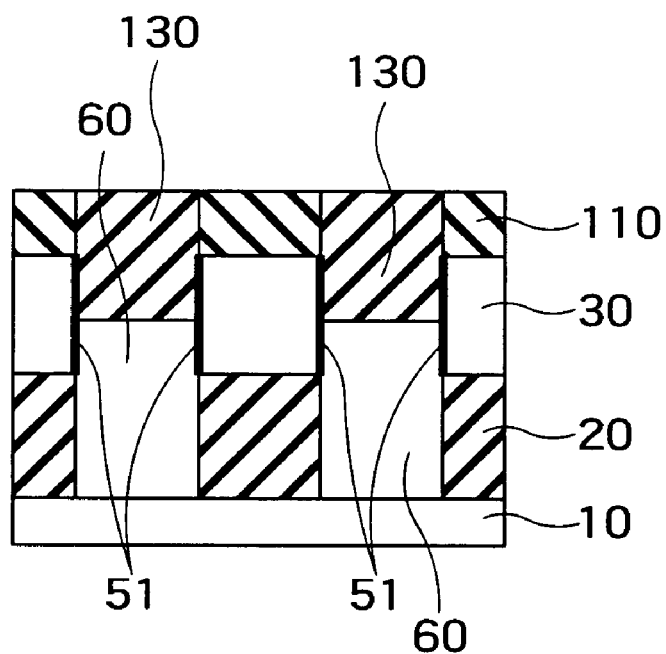

Subsequently, by using lithography technique and RIE, the silicon nitride films 110 are processed so as to cover the gate electrode formation area and the body formation area. After that, a silicon oxide film is deposited and polished by using CMP to the surface level of the silicon nitride films 110. By the operation, the structure shown in FIGS. 9A and 9B is obtained.

Subsequently, by using a hot phosphoric acid solution, the silicon nitride films 110 are removed. After that, a silicon nitride film 140 is deposited and anisotropically etched by RIE. The silicon nitride films 140 are left as spacers on the side surfaces of the silicon oxide films 130 formed by the removal of the silicon nitride films 110. Hereinafter, the processed silicon nitride film 140 will be also called a spacer 140.

Figure 10A:
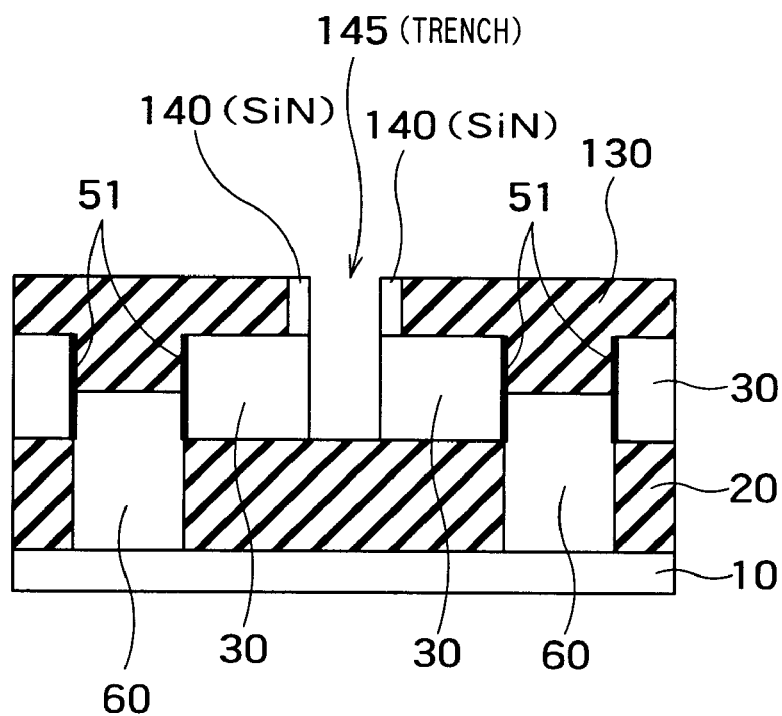
Figure 10B:
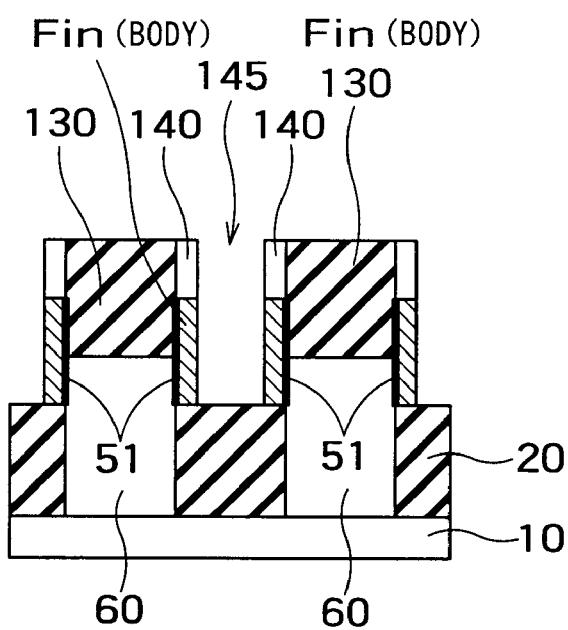

By using the silicon oxide film 130 and the spacer 140 as a mask, the SOI layer 30 is etched by RIE as shown in FIGS. 10A and 10B. By the etching, trenches 145 are formed as shown in FIG. 10B, and the SOI layer 30 is etched in width determined by the spacers 140. The portions of the SOI layer 30 serve as two Fins (bodies). That is, the width of the two Fins (bodies) is controlled by the width of the spacers 140. In this process, the SOI layer 30 is etched so as to reach the BOX layer 20. In the case of forming channels under the gate electrodes G, the etching of the SOI layer 30 is stopped before it reaches the BOX layer 20.

Figure 11A:
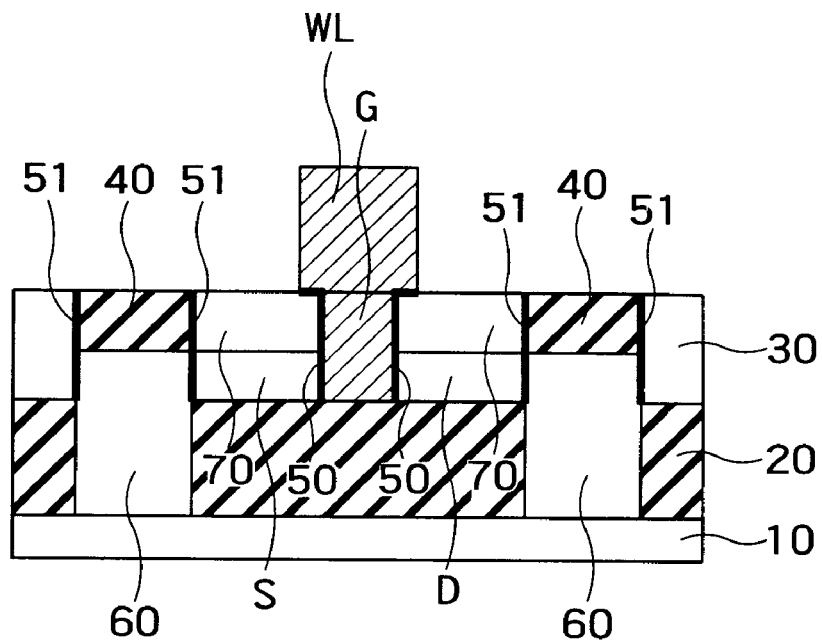
Figure 11B:
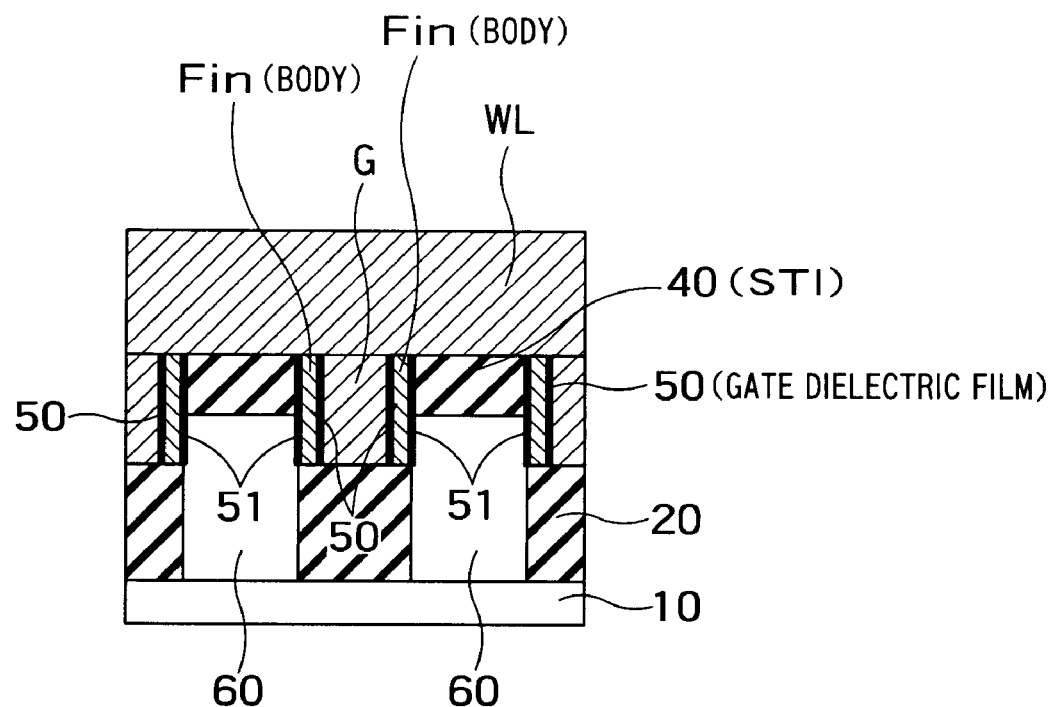

Next, the spacers 140 are removed by using the hot phosphoric acid solution and, further, the silicon oxide films 130 are etched back to the top surface level of the SOI layer 30 by using RIE, CMP, wet etching, or the like. Subsequently, as shown in FIGS. 11A and 11B, the gate dielectric films 50 of a silicon oxide film, a silicon nitride film, or a high dielectric film having permittivity higher than that of a silicon oxide film are formed on the side surfaces of the SOI layer 30 in the trenches 145. Further, the gate electrodes G are formed filling the trenches 145 and the word lines WL are formed. The gate electrodes G and the word lines WL are made of, for example, polysilicon, metal, or silicide. The gate electrodes G and the word lines WL may be formed by the same process.

Next, by using the word lines WL as a mask, the diffusion layers of the sources S and the drains D are formed. Further, silicide layers 70 are formed on the sources S and the drains D. After that, the interlayer insulating film 11, the contact plugs 12, the bit lines BL, the source lines SL, and the like are formed as shown in FIGS. 1 and 3 by using a known method, thereby completing the semiconductor memory device.

Ion implantation to the sources S and the drains D may be executed after the process on the silicon nitride film 110 shown in FIGS. 9A and 9B.

In the process of etching back the silicon oxide film 130 by RIE, there is a case that the BOX layer 20 is etched. This can be prevented only by etching back the silicon oxide film 130 after the trenches 145 are filled with resist in the process shown in FIGS. 10A and 10B.

Modification of First Embodiment

Figure 12:
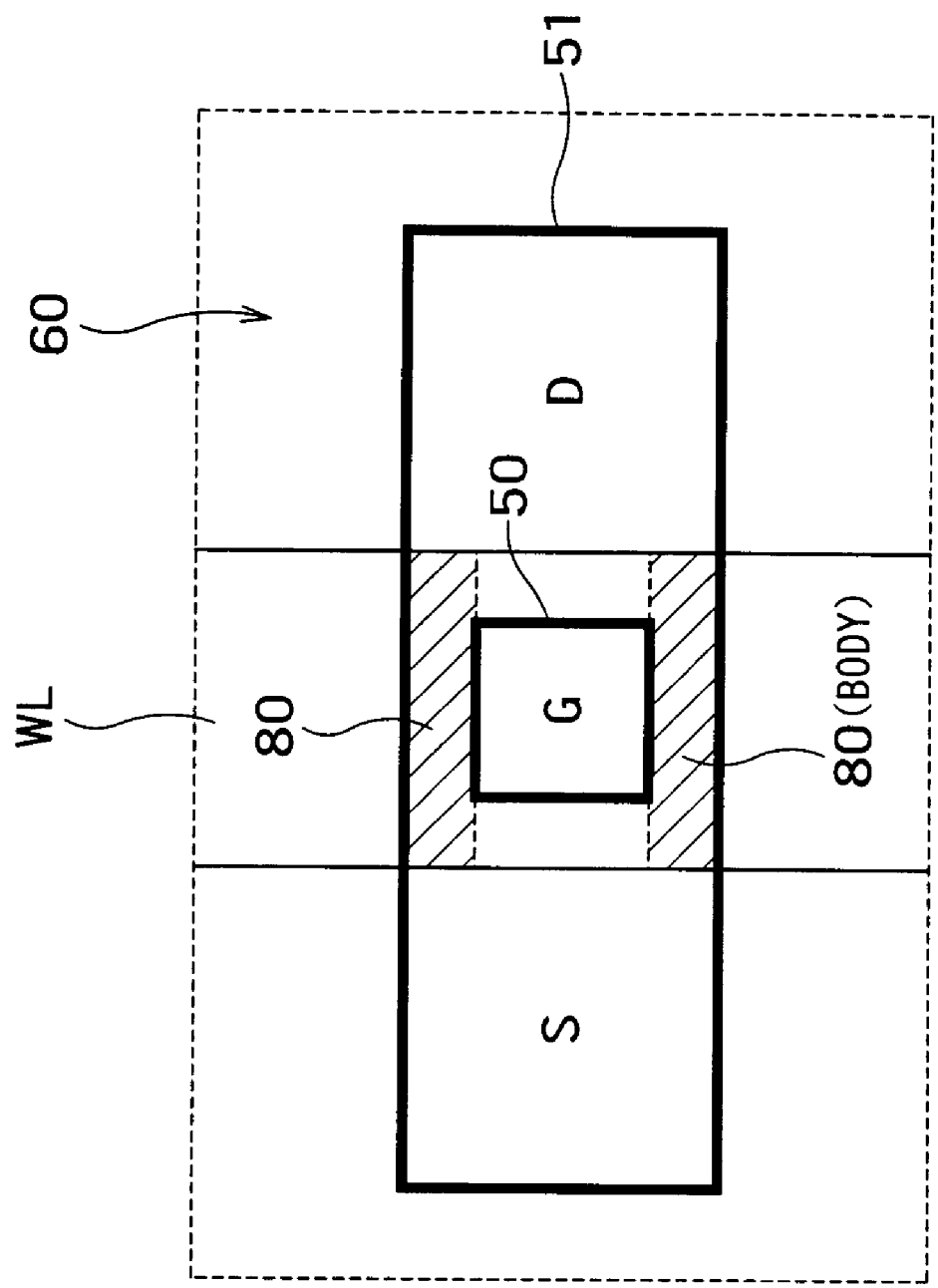
FIG. 12 is a plan view showing a memory cell MC of a modification of the first embodiment.

FIG. 12 is a plan view showing a memory cell MC of a modification of the first embodiment. In the first embodiment, as shown in FIG. 2, the channel length (the length of the body 80) is almost equal to the length of the gate electrode G in the channel length direction. In the first embodiment, the distance between the source and the drain is relatively short, therefore the resistance between the source and drain can be low. Therefore, the current drive ability of the FBC improves.

In the modification, as shown in FIG. 12, the channel length (the length of the body 80) is larger than the length of the gate electrode G in the channel length direction and is almost equal to the width of the word line WL. In the modification, the distance between the source and the drain is relatively long. Accordingly, the facing areas between the plate electrode 60 and the body 80 can be further larger, so that the capacitance between the plate electrode 60 and the body 80 is made high. Therefore, the signal difference between the data "1" and the data "0" can be further larger, and the data retention characteristic can be further improved.

Second Embodiment

Figure 13:
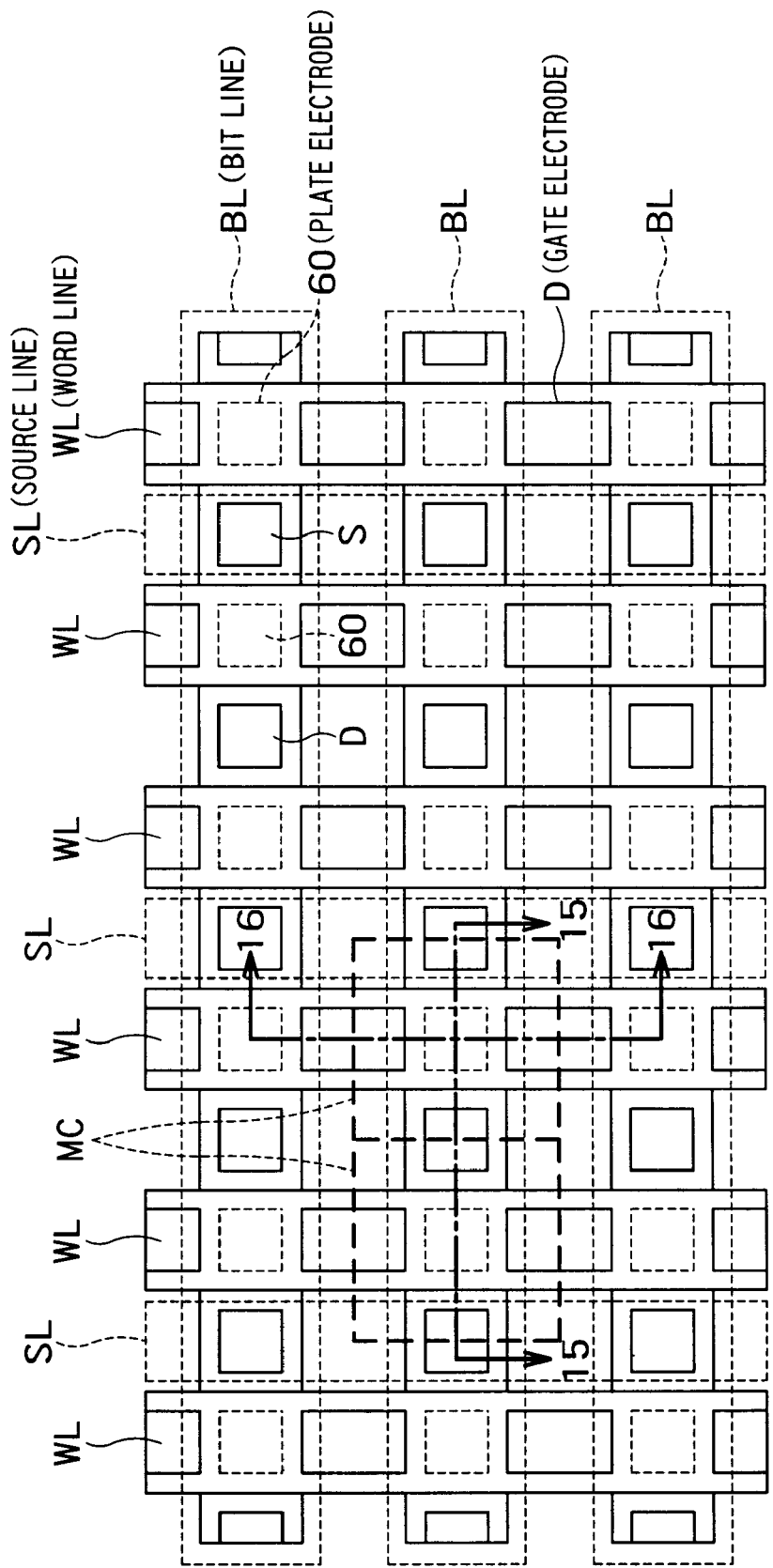
FIG. 13 is a plan view of an FBC memory of a second embodiment of the invention.

FIG. 13 is a plan view of an FBC memory of a second embodiment of the invention. Portions indicated in broken-line frames are two memory cells MC. In the FBC memory cell of the first embodiment, a gate electrode is provided between the inner side surfaces of the two fins, and the plate electrodes are provided on the outer side surfaces. In contrast, in the FBC of the second embodiment, gate electrodes are provided on the outer side surfaces of two fins, and a plate electrode is provided between the inner side surfaces.

Figure 14:
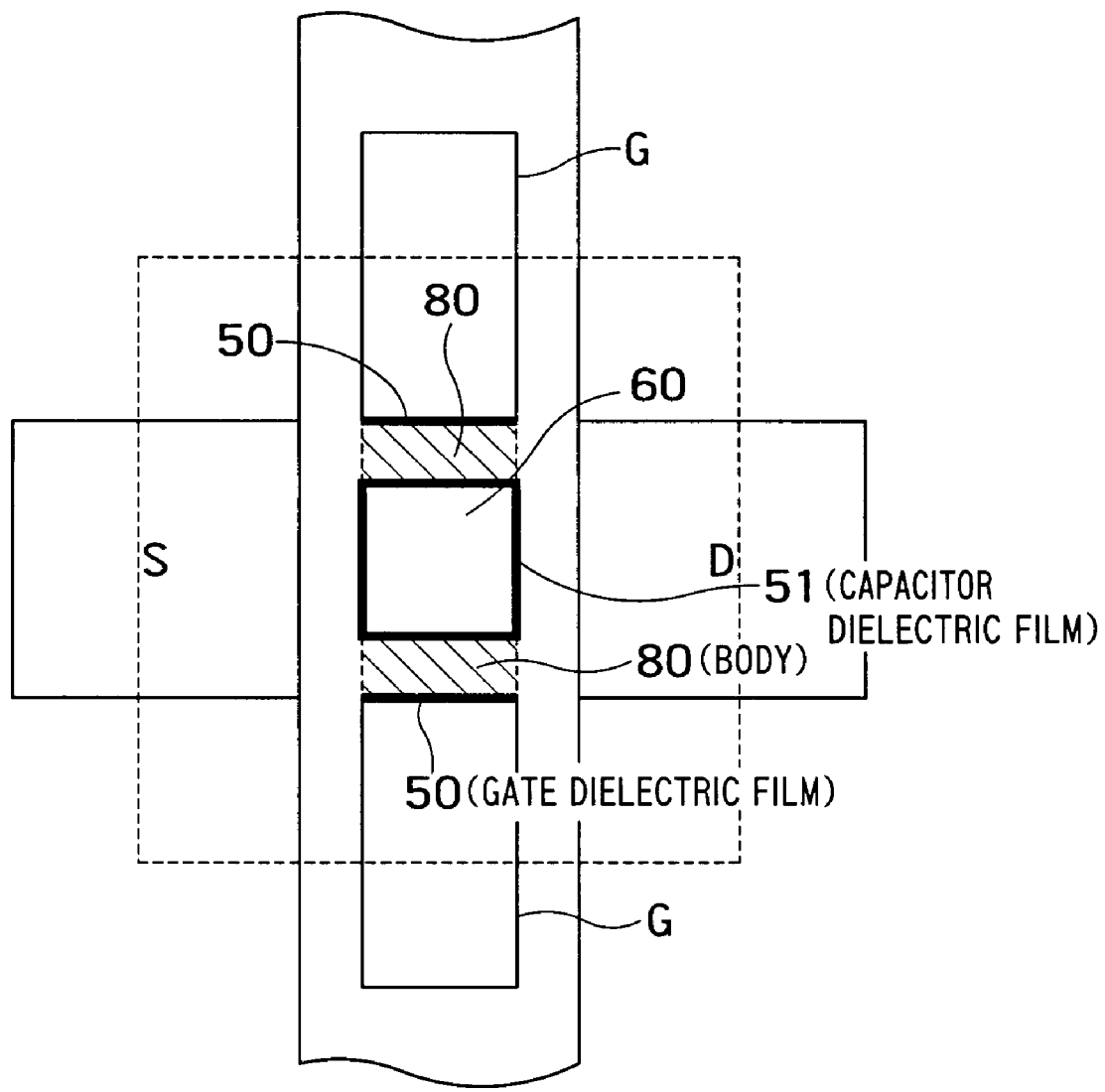
FIG. 14 is a plan view showing one memory cell MC more specifically.
Figure 15:
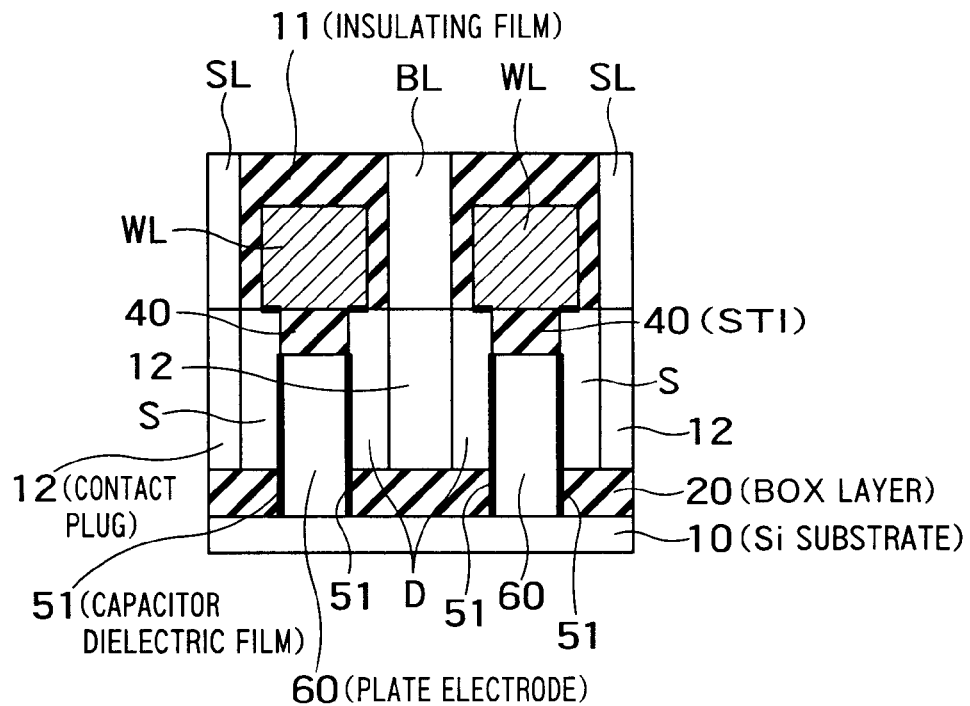
FIG. 15 is a cross section taken along line 15-15 in FIG. 13.
Figure 16:
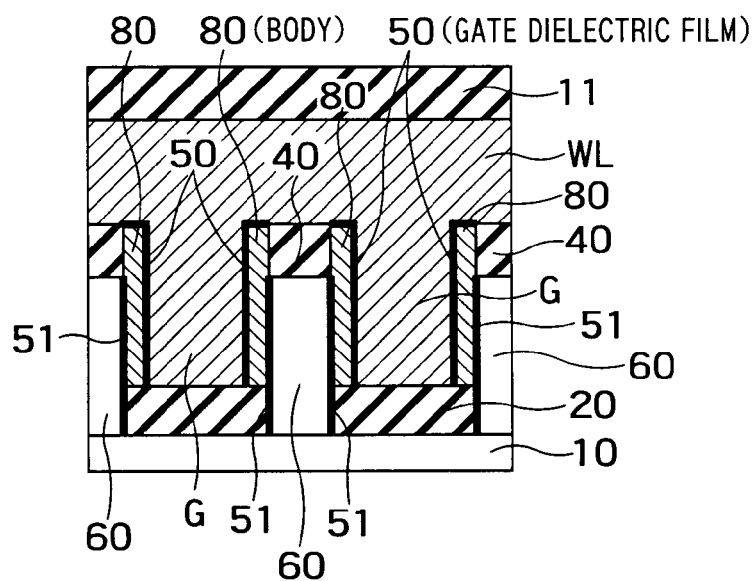
FIG. 16 is a cross section taken along line 16-16 shown in FIG. 13.

FIG. 14 is a plan view showing one memory cell MC more specifically. FIG. 15 is a cross section taken along line 15-15 in FIG. 13. FIG. 16 is a cross section taken along line 16-16 shown in FIG. 13. As shown in FIGS. 14 to 16, bodies 80 are provided not fully but partly in the space between the source and the drain. A plate electrode 60 is buried in remaining portion of the space between the source and the drain. The gate electrodes G are constructed to apply potential to the bodies 80 from the outer side surfaces of the bodies 80 (Fin). With such a configuration as well, the FBC can obtain an effect similar to that of the first embodiment.

The second embodiment is different from the first embodiment with respect to the point that the source S, the drain D, and the contact plug 12 are formed by being buried. With the configuration, the source S and the drain D face the body 80 in a whole of the channel width. The contact areas between the diffusion layers of the source S and the contact plug 12 and between the diffusion layers of the drain D and the contact plug 12 are made large. Therefore, resistance in each of the source S and the drain D can be reduced. The FBC in the second embodiment can be constructed as a so-called $4F^2$-sized FBC. In the $4F^2$-sized FBC, the neighboring memory cells MC share one source line SL or one bit line BL, so that the area of the whole memory cell array can be reduced.

FIGS. 17A to 24B are cross sections showing a method of manufacturing an FBC memory of the second embodiment. FIGS. 17A, 18A, 19A, 20A, 21A, 22A, 23A and 24A show a method of manufacturing the FBC memory in the cross section of FIG. 15. FIGS. 17B, 18B, 19B, 20B, 21B, 22B, 23B and 24B show a method of manufacturing the FBC memory in the cross section of FIG. 16.

To form a hard mask, the silicon nitride film 110 is deposited on the SOI layer 30. The silicon nitride film 110 is patterned so as to cover the active areas (refer to FIG. 17C). By the patterning, the silicon nitride film 110 on the formation areas of the STIs 40 is removed. By using the silicon nitride films 110 as a mask, the SOI layer 30 is etched by RIE (Reactive Ion Etching). By the etching, trenches are formed in device isolation areas. By forming silicon oxide films filling the trenches, the STIs 40 are formed in stripes as shown in FIGS. 17A to 17C.

Next, by using lithography technique and RIE, the silicon nitride films 110 are processed in a striped pattern with space of ½ of the word line width. After that, silicon oxide films 41 are filled in the gaps each having the width of the half of WL. As a result, the structure shown in FIGS. 18A to 18C is obtained.

Figure 19A:
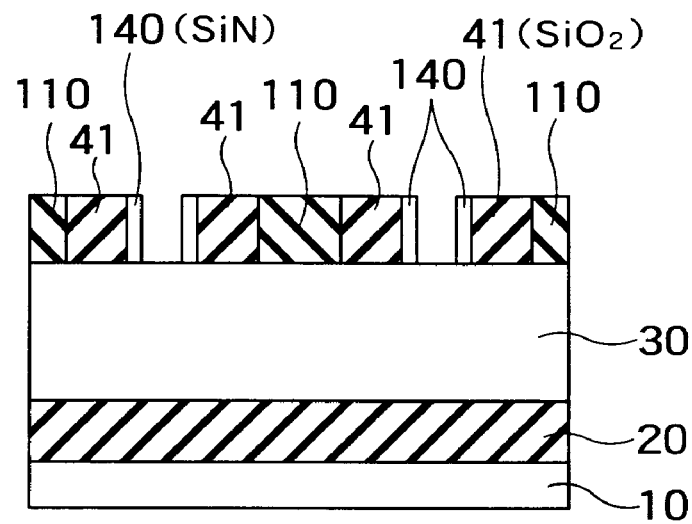
Figure 19B:
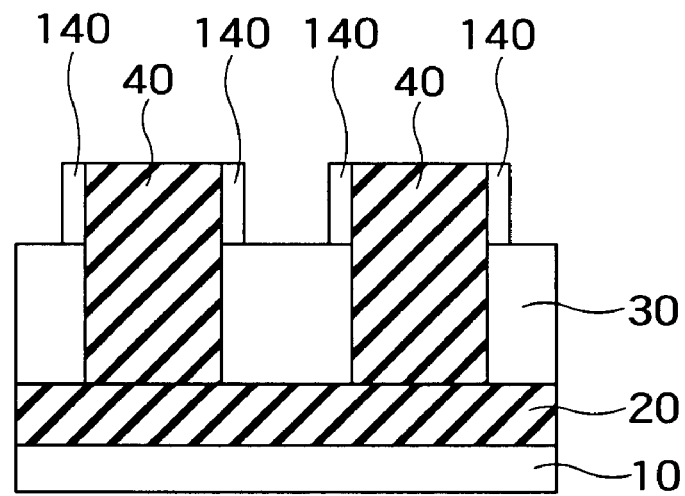

The silicon nitride films 110 on the body formation areas are removed by using the lithography technique and the hot phosphoric acid solution. Subsequently, as shown in FIGS. 19A and 19B, the spacers (silicon nitride films) 140 are formed on the side surfaces of the silicon oxide films 40 and 41.

Figure 20A:
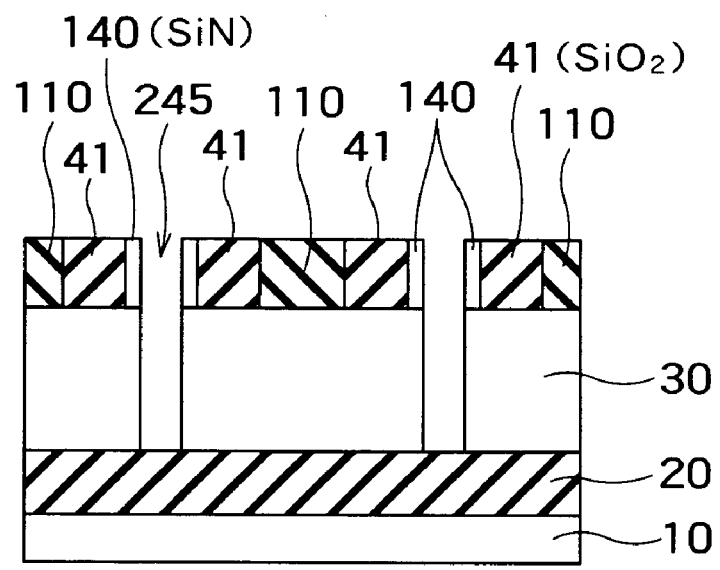
Figure 20B:
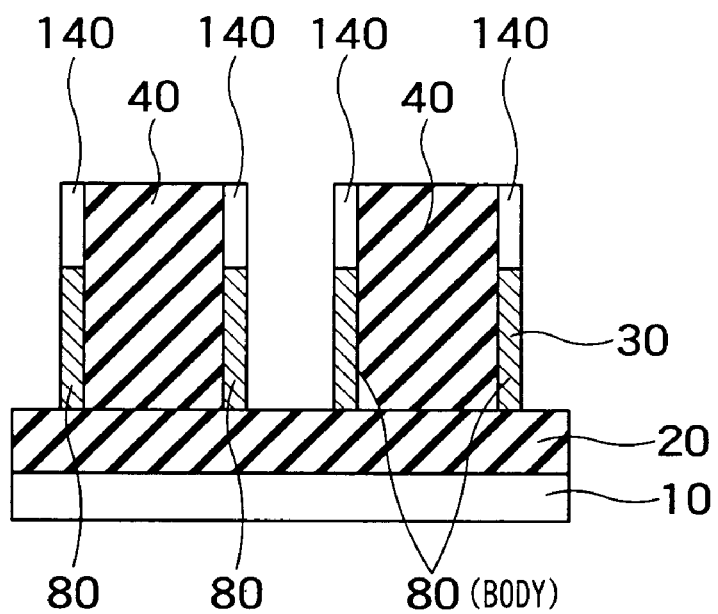

Subsequently, by using the silicon oxide films 40 and 41, the silicon nitride films 110, and the spacers 140 as a mask, the SOI layer 30 is etched by RIE. As shown in FIG. 20B, the SOI layer 30 is etched in the width determined by the spacers 140. The portions of the SOI layer 30 serve as two Fins (bodies) 80.

Figure 21A:
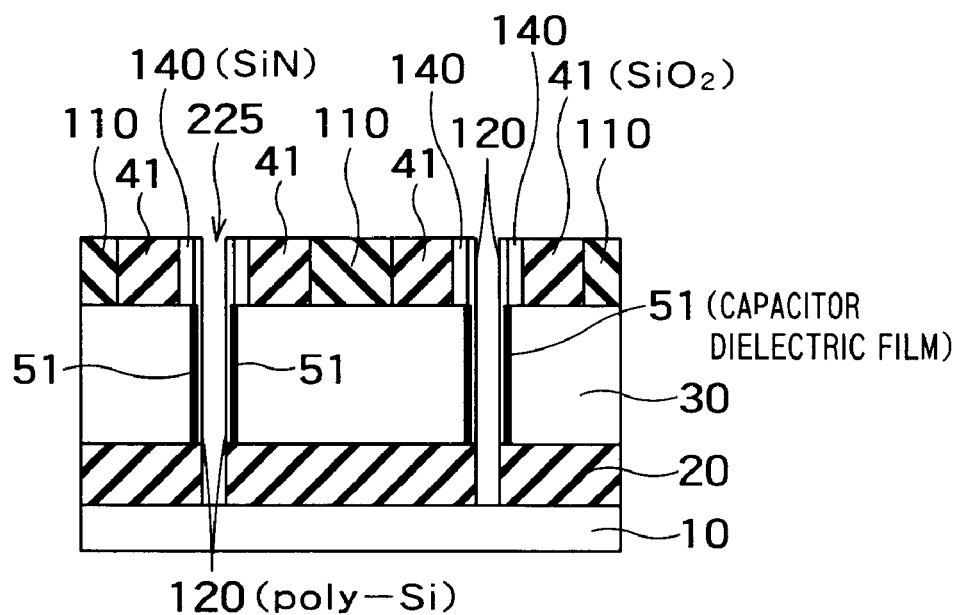
Figure 21B:
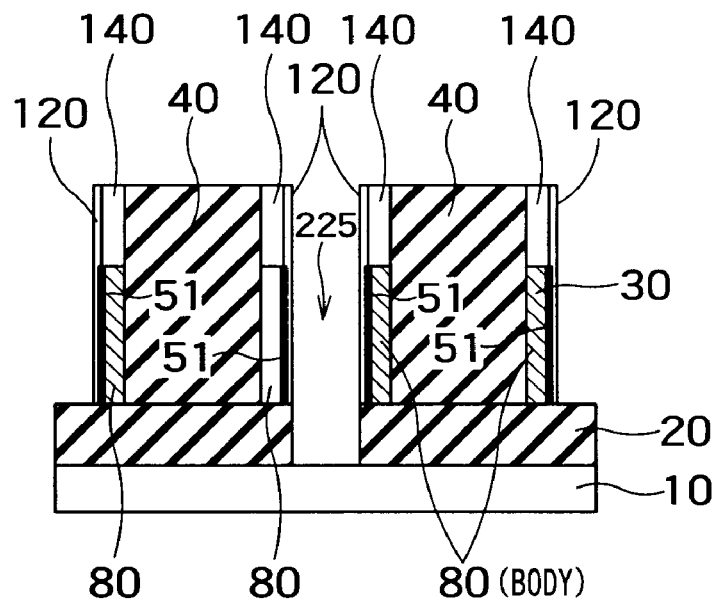

Next, in a manner similar to the first embodiment, the capacitor dielectric films 51 are formed on the side surfaces of the SOI layer 30. Further, the polysilicon film 120 is deposited on the capacitor dielectric films 51. In the second embodiment, the capacitor dielectric films 51 are formed on the inner side surfaces which face each other among the side surfaces of the two Fins. Next, by using the polysilicon films 120 and the silicon nitride films 110 as a mask, the BOX layer 20 is etched by RIE. By the etching, trenches 225 reaching the silicon substrate 10 are formed as shown in FIGS. 21A and 21B. In this case, since the capacitor dielectric films 51 are protected by the polysilicon films 120, the capacitor dielectric films 51 are not etched.

Figure 22A:
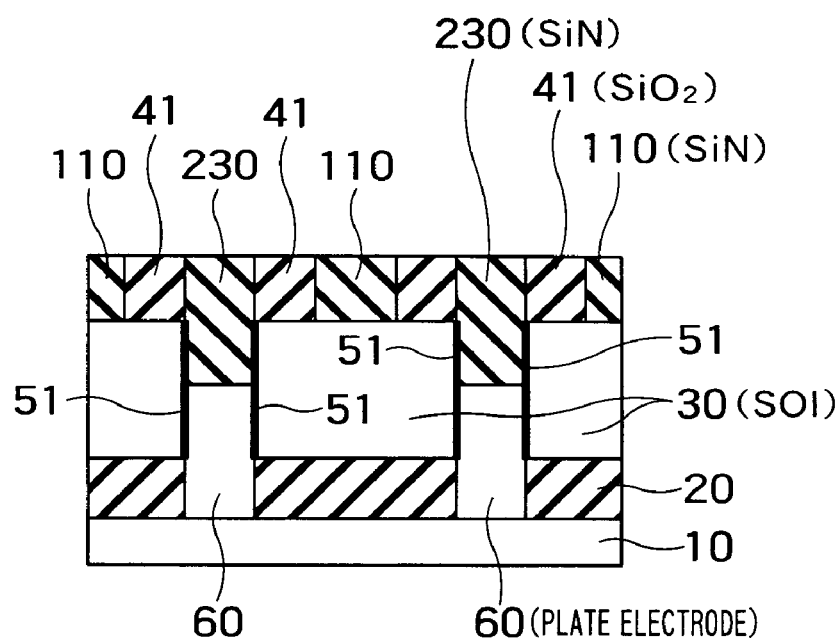
Figure 22B:
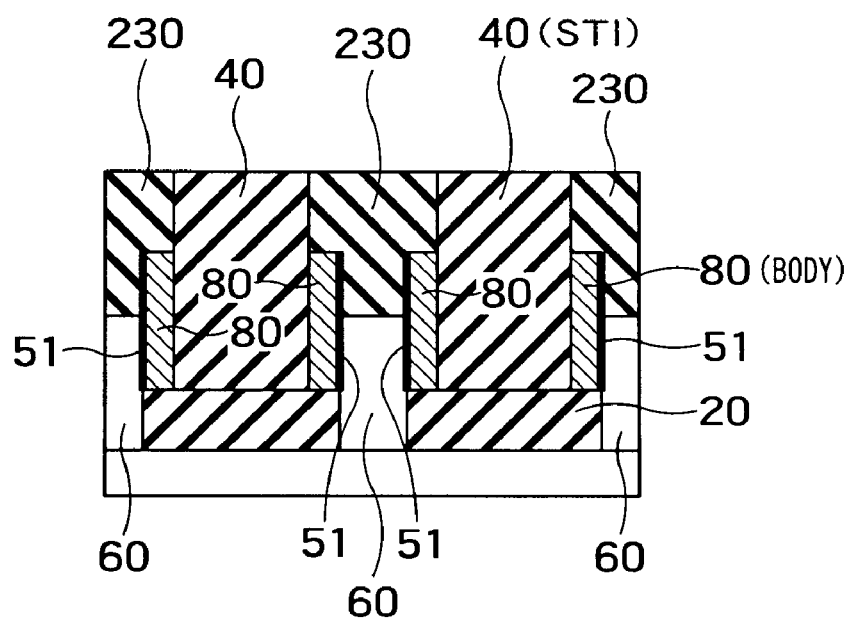

After that, the trenches 225 are filled with polysilicon. Subsequently, the plate electrodes 60 are formed as shown in FIGS. 22A and 22B by etching back the polysilicon. In the process, the capacitance between the plate electrode 60 and the body 80 can be adjusted by adjusting the etching amount of the polysilicon. Next, the trenches 225 are buried by depositing a silicon nitride film 230 on the plate electrode 60. Further, the silicon nitride film 230 is polished by CMP to the top surface level of the STI (silicon oxide film) 40. As a result, the structure shown in FIGS. 22A and 22B is obtained.

Figure 23A:
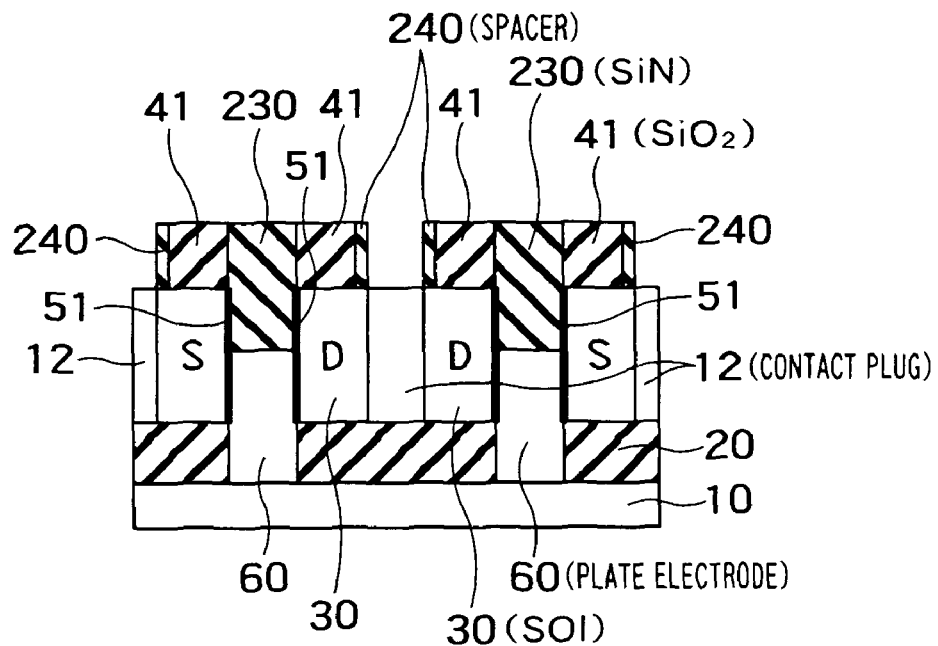
Figure 23B:
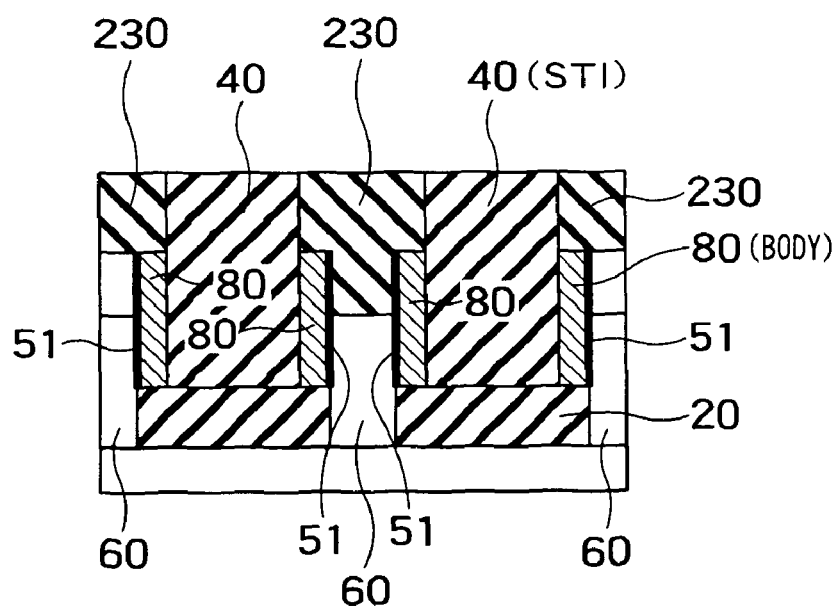

Subsequently, by using the lithography technique and the hot phosphoric acid solution, the silicon nitride films 110 are removed and spacers 240 of silicon nitride are formed on the side surfaces of the silicon oxide films 41 as shown in FIG. 23A. By using the spacer 240, the silicon oxide film 41, and the like as a mask, the SOI layer 30 is etched by RIE. Further, the contact plugs 12 are formed by filling trenches formed by the etching with doped polysilicon. Impurities included in the contact plugs 12 are diffused into the SOI layers 30 by the following thermal process, thereby forming the diffusion layers of the sources S and the drains D.

Figure 24A:
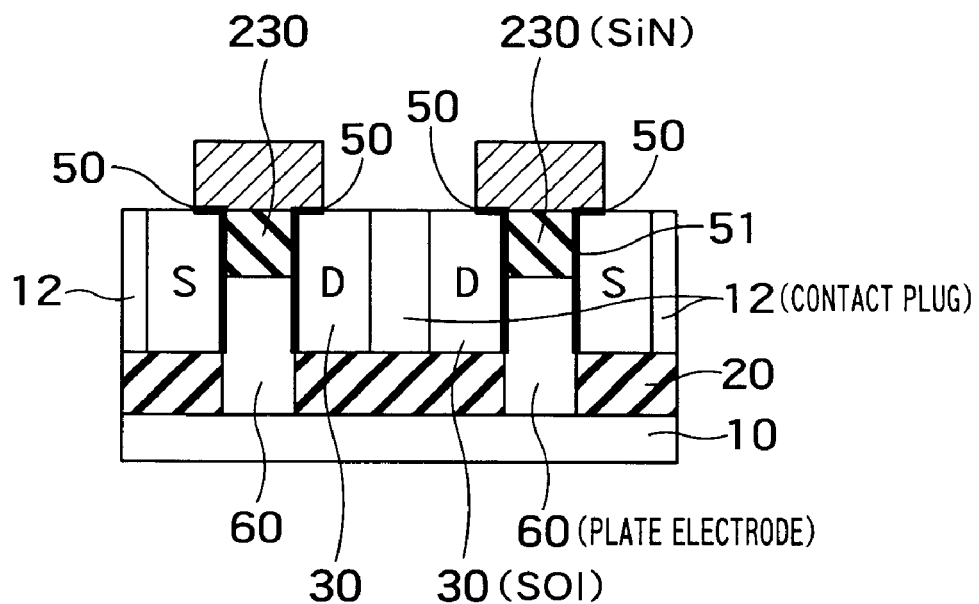
Figure 24B:
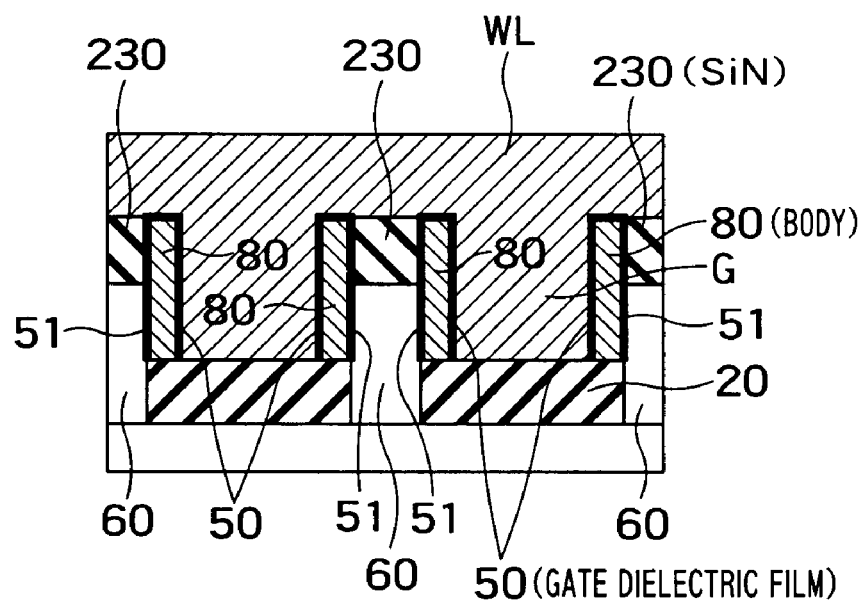

The spacers 240 are removed and then a silicon oxide film is deposited. Subsequently, the silicon oxide film is etched back until the surface of the SOI layers 30 and the contact plugs 12 are exposed. Further, the STIs 40 in the areas of the gate electrodes G shown in FIG. 13 are removed. As shown in FIG. 24B, the gate electrode G is buried in the outer side surfaces of the Fins (bodies 80). At this time, gate dielectric film 50 is formed also on the top surface of the bodies 80, therefore the gate electrodes G and the word lines WL are electrically insulated from the bodies 80, the sources S, and the drains D as shown in FIGS. 24A and 24B.

After that, the interlayer insulating film 11, the bit line BL, the source line SL, and the like are formed by using a known method as shown in FIGS. 15 and 16, thereby completing a semiconductor memory device.

In the processes shown in FIGS. 23A to 24B, the implantation of ions to the sources S and the drains D may be also executed when the top surfaces of the SOI layers 30 are exposed.

Modification of Second Embodiment

Figure 25:
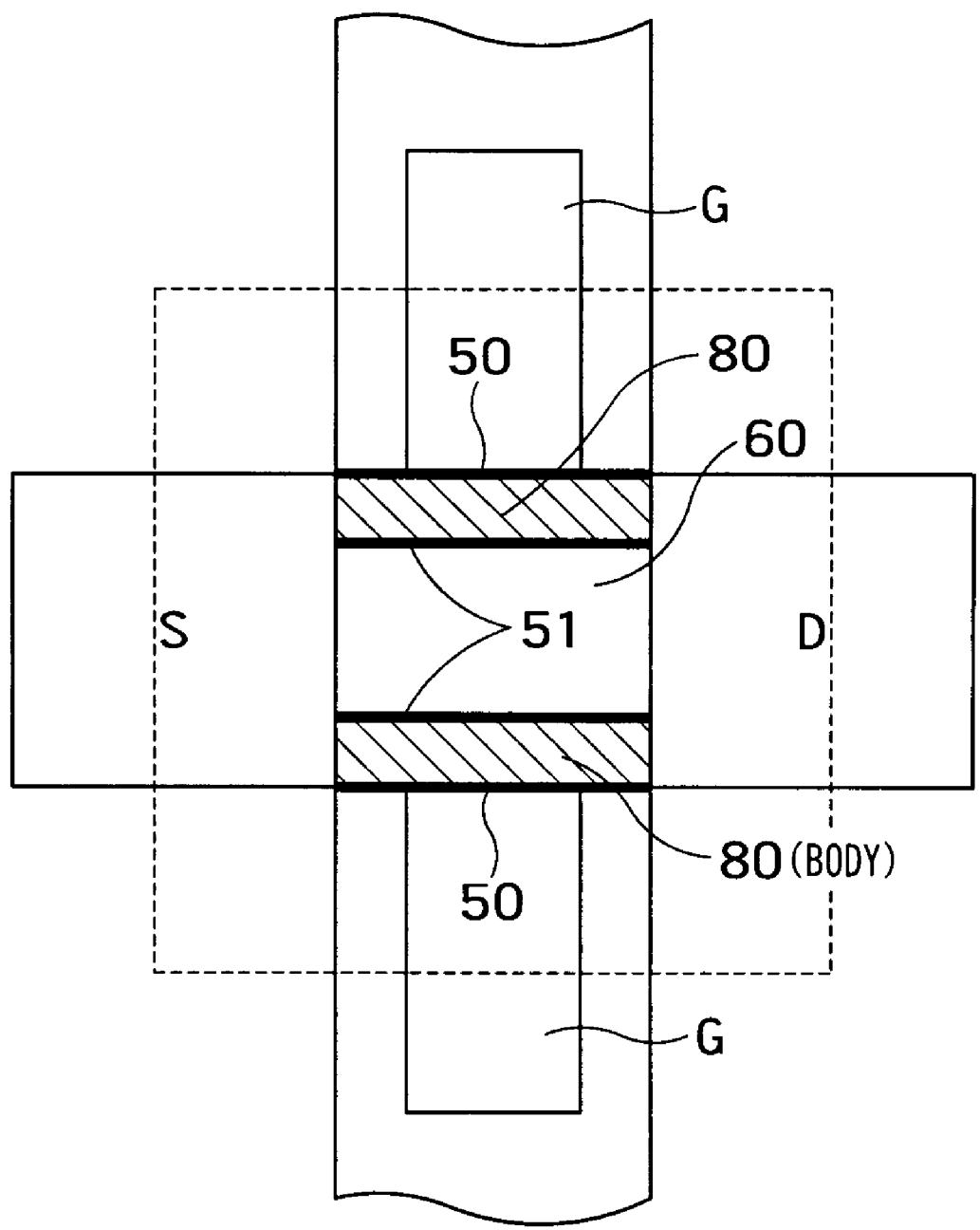
FIG. 25 is a plan view showing a memory cell MC as a modification of the second embodiment.

FIG. 25 is a plan view showing a memory cell MC as a modification of the second embodiment. In the second embodiment, as shown in FIG. 14, the channel length (the length of the body 80) is almost equal to the length in the channel length direction of the gate electrode G. In the second embodiment, the distance between the source and the drain is relatively short, so the resistance between the source and drain can be low. Therefore, the current drive ability of the FBC improves.

In the modification, as shown in FIG. 25, the channel length (the length of the body 80) is larger than the length in the channel length direction of the gate electrode G and is almost equal to the width of the word line WL. In the modification, the distance between the source and the drain is relatively large. Accordingly, the facing area between the plate electrode 60 and the body 80 can be further larger, so that the capacitance between the plate electrode 60 and the body 80 is made larger. Therefore, the signal difference between the data "1" and the data "0" can be further larger, and the data retention characteristic can be further improved.

In the second embodiment, the contact plugs 12 are buried so as to be adjacent to the sources S and the drains D. The contact plugs 12 in the first embodiment may be also buried so as to be adjacent to the source S and the drain D. In this case, the process of forming the contact plugs 12 so as to be buried (refer to FIGS. 23A and 23B) may be executed at the time of forming the sources S and the drains D in the first embodiment (refer to FIGS. 10A and 11B).

Figure 26A:
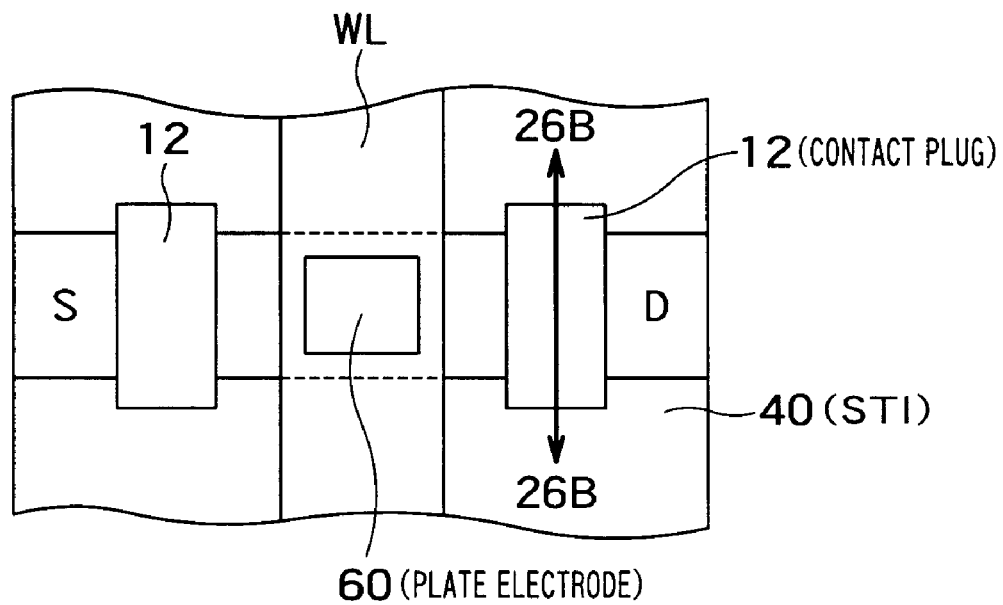
FIGS. 26A and 26B showing a modification of the contact plug 12.
Figure 26B:
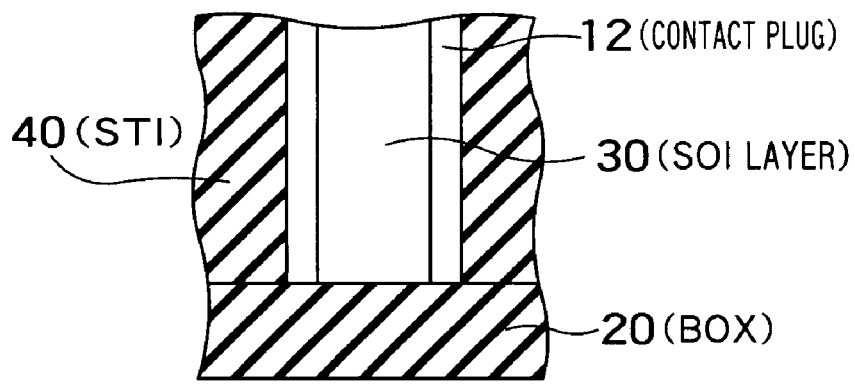

In the second embodiment, the contact plugs 12 are buried in the inside of the Fins. Alternatively, the contact plugs 12 may be buried in both side surfaces of the Fins. For example, as shown in FIGS. 26A and 26B, the borders between the STIs 40 and the SOI layers 30 are etched to expose the side surfaces of the SOI layers 30. The contact plugs 12 are formed filling trenches formed by the etching. By the operation, the contact plugs 12 can be buried in both side surfaces of the Fins. Obviously, the contact plug 12 can be also applied to the first embodiment.

The invention claimed is:

1. A semiconductor memory device comprising:
   a semiconductor substrate;
   a first dielectric film provided on the semiconductor substrate;
   two Fins provided on the first dielectric film and made of a semiconductor material;
   a second dielectric film provided on first side surfaces among side surfaces of the two Fins, the first side surfaces being inner side surfaces among side surfaces of the two Fins so as to oppose each other;
   a third dielectric film provided on second side surfaces among side surfaces of the two Fins, the second side surfaces being outer side surfaces among side surfaces of the two Fins;
   a gate electrode provided between the first side surfaces of the two Fins and provided on the first side surfaces via the second dielectric film; and
   at least a plate electrode provided on the second side surfaces of the two Fins via the third dielectric film,
   wherein the gate electrode forms transistors on the first side surfaces and is not provided on the second side surfaces, and the plate electrodes form capacitors on the second side surfaces and are not provided on the first side surfaces,
   wherein the two Fins, the gate electrode, and the plate electrodes are included in one memory cell.

2. The semiconductor memory device according to claim 1, wherein
   the two Fins are connected each other under the gate electrode.

3. The semiconductor memory device according to claim 2 further comprising:
   a device isolation part provided on the plate electrode, wherein
   capacitance between the plate electrode and the two Fins is changed by changing thickness of the device isolation part.

4. The semiconductor memory device according to claim 1 further comprising:
   a device isolation part provided on the plate electrode, wherein
   capacitance between the plate electrode and the two Fins is changed by changing thickness of the device isolation part.

5. The semiconductor memory device according to claim 1, wherein
   the each width of the two Fins is equal to a width of the gate electrode in a cross section in the channel length direction of the memory cell.

6. The semiconductor memory device according to claim 1, wherein
   the each width of the two Fins is wider than a width of the gate electrode in a cross section in the channel length direction of the memory cell.

7. The semiconductor memory device according to claim 1 further comprising:
   diffusion layers provided in the semiconductor material, the diffusion layers being located on both sides of the gate electrode; and
   a contact plug buried in the side surface of a part of the semiconductor material, in which part the diffusion layers are formed.

8. A semiconductor memory device comprising:
   a semiconductor substrate;
   a first dielectric film provided on the semiconductor substrate;
   two Fins provided on the first dielectric film and made of a semiconductor material;
   a second dielectric film provided on first side surfaces among side surfaces of the two Fins, the first side surfaces being inner side surfaces among side surfaces of the two Fins so as to oppose each other;
   a third dielectric film provided on second side surfaces among side surfaces of the two Fins, the second side surfaces being outer side surfaces among side surfaces of the two Fins;
   a plate electrode provided between the first side surfaces of the two Fins and provided on the first side surfaces via the second dielectric film; and
   gate electrodes respectively provided on the second side surfaces of the two Fins via the third dielectric film,
   wherein the plate electrode form capacitors on the first side surfaces and is not provided on the second side surfaces, and the gate electrodes form transistors on the second side surfaces and are not provided on the first side surfaces, and
   wherein the two Fins, the plate electrode, and the gate electrodes are included in one memory cell.

9. The semiconductor memory device according to claim 8, wherein
   the two Fins are connected each other under the plate electrode.

10. The semiconductor memory device according to claim 9 further comprising:
    a device isolation part provided on the plate electrode, wherein
    capacitance between the plate electrode and the two Fins is changed by changing thickness of the device isolation part.

11. The semiconductor memory device according to claim 8 further comprising:
    a device isolation part provided on the plate electrode, wherein
    capacitance between the plate electrode and the two Fins is changed by changing thickness of the device isolation part.

12. The semiconductor memory device according to claim 8, wherein
    the each width of the two Fins is equal to a width of the gate electrodes in a cross section in the channel length direction of the memory cell.

13. The semiconductor memory device according to claim 8, wherein
the each width of the two Fins is wider than a width of the gate electrodes in a cross section in the channel length direction of the memory cell.

14. The semiconductor memory device according to claim 8, further comprising:
diffusion layers provided in the semiconductor material, the diffusion layers being located on both sides of the gate electrode; and
a contact plug buried in the side surface of a part of the semiconductor material, in which part the diffusion layers are formed.

* * * * *